(12) United States Patent
Maier

(10) Patent No.: US 8,816,747 B2
(45) Date of Patent: Aug. 26, 2014

(54) DIGITAL INPUT UNIT

(71) Applicant: Siemens Aktiengesellschaft, Munich (DE)

(72) Inventor: Willi Maier, Oppenau (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/785,854

(22) Filed: Mar. 5, 2013

(65) Prior Publication Data

US 2013/0229219 A1 Sep. 5, 2013

(30) Foreign Application Priority Data

Mar. 5, 2012 (EP) .................................. 12158020

(51) Int. Cl.
 *H03L 5/00* (2006.01)
(52) U.S. Cl.
 USPC .......................................... 327/309; 327/322
(58) Field of Classification Search
 USPC ................................. 327/306–333
 See application file for complete search history.

(56) References Cited

U.S. PATENT DOCUMENTS 5,422,593 A * 6/1995 Fujihira .................... 327/561
5,852,383 A   12/1998 Rombach

FOREIGN PATENT DOCUMENTS

| DE | 19547754 C1 |   | 4/1997  |
|----|-------------|---|---------|
| EP | 1906533     | * | 2/2008  |
| FR | 2824424 A1  |   | 11/2002 |

OTHER PUBLICATIONS

Siemens Manual for "SIMATIC S7-300, Automatisierungssystem, Baugruppendaten", Issue Aug. 2009, published in Germany.

* cited by examiner

*Primary Examiner* — Dinh T. Le
(74) *Attorney, Agent, or Firm* — Cozen O'Connor

(57) ABSTRACT

A digital input unit for an automation device includes at least one current drawing DC input channel for connecting a transducer operated at a nominal DC voltage, where the input channel is configured to set the current based on an input voltage (UEM) according to an input characteristic curve. Measures are proposed, as a result of which the digital input unit is suitable for connecting transducers of different supply voltages, where the digital input unit is operable with a reduced power loss.

2 Claims, 1 Drawing Sheet

DIGITAL INPUT UNIT

BACKGROUND OF THE INVENTION

1. Field of the Invention

The invention relates to a digital input unit for an automation device having at least one current-drawing DC input channel for connecting a transducer operated at a nominal DC voltage, where the input channel is configured to set the current based on the input voltage according to an input characteristic curve.

2. Description of the Related Art

Such a digital input unit is known from the Siemens device handbook "SIMATIC, S7-300, Automatisierungssystem S7-300, Baugruppendaten" [SIMATIC, S7-300, S7-300 automation system, assembly data], chapter 3, issue 08/2009. A transducer can be connected to one of the input channels, for example, a transducer in the form of a Bero proximity switch which is designed for a nominal DC voltage of 24 or 48 V, an input characteristic curve complying with a so-called type 1 or type 2 characteristic according to the IEC 61131 or EN 61131 standard.

This standard prescribes current and voltage limits for 0 and 1 signal states for the type 1 and type 2 characteristics, the current limits according to the type 2 characteristic being higher than those predefined according to the type 1 characteristic. According to the type 1 characteristic, the upper current limit for a 0 or 1 signal state is 15 mA, but is 30 mA according to the type 2 characteristic. In other words: a type 2 digital input unit has a more current-intensive characteristic than a type 1 digital input unit.

The situation may then occur in which, on account of a customer requirement, a digital input unit must perform functions for a multiplicity of transducers of different nominal DC voltages. In this case, the digital input unit must be designed for a multiplicity of DC input voltages, for example in a range from 24 V to 125 V. Such a "wide-range input" of 24 V to 125 V results in a high power loss and thermal load in the case of DC input voltages of greater than the 30 V voltage mentioned with regard to the 1 signal state on account of the current-intensive type 2 characteristic for this 1 signal state, which has a disadvantageous effect on the service life of the digital input unit.

SUMMARY OF THE INVENTION

It is therefore an object of the invention to provide a digital input unit which is suitable for connecting transducers of different supply voltages and which is operable with a reduced power loss.

This and other objects and advantages are achieved by virtue of the fact that an input channel of the digital input unit is configured to limit the input current to a first value up to a changeover voltage, where the changeover voltage is greater than or equal to a voltage limit up to which a 1 signal state is represented, and is configured to limit the input current to a second value lower than the first value above this changeover voltage.

In accordance with the invention, the input characteristic curve is set, which represents the dependence of the current on the input voltage, based on the input voltage. As a result, the input characteristic curve is optimized such that, on the one hand, the advantages of the type 2 characteristic are achieved in the case of small input voltages up to a changeover voltage limit or a changeover voltage and, on the other hand, the disadvantages of this type 2 characteristic with respect to the power loss are avoided in the case of large input voltages above this changeover voltage limit. In this case, in order to avoid this disadvantage, the input current is reduced to the input current according to the type 1 characteristic in the case of large input voltages above the changeover voltage limit.

One embodiment of the invention provides simple circuitry measures which are used to set the constant current to the first or second value.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention, its refinements and advantages are explained in more detail below using the drawing which illustrates an exemplary embodiment of the invention and in which.

DETAILED DESCRIPTION OF THE PREFERRED EMBODIMENTS

Figure 1:
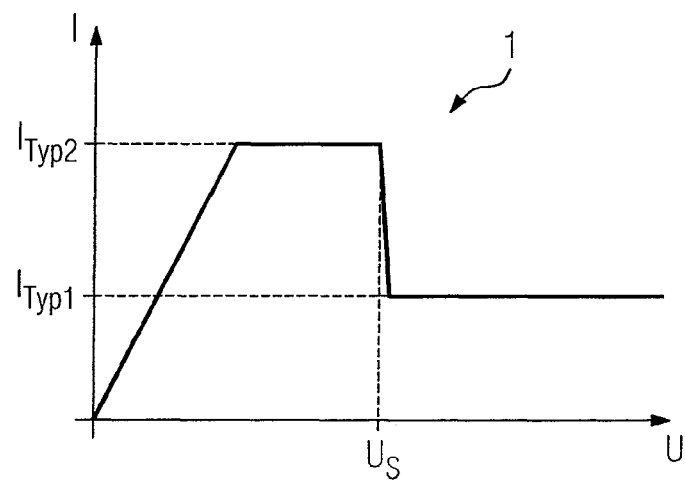
FIG. 1 shows a graphical plot of an input characteristic curve.

In FIG. 1, numeral 1 is used to denote an input characteristic curve of a digital input unit, where the input characteristic curve represents the dependence of an input current I on an input voltage U, and the digital input unit is provided, for example, for a "wide-range input" with a nominal DC voltage range of 24 V to 125 V. Up to an input voltage limit of 30 V, which represents the upper limit of the 24-V nominal range, the digital input unit has a type 2 behavior according to the IEC 61131 or EN 61131 standard. For a current-drawing input of such a digital input unit, the input voltage U in a range of −3 V to 5 V and the input current I in a range of ND (Not Defined) to 30 mA represent a 0 state and the input voltage U in a range of 11 V to 30 V and the input current I in a range of 6 mA to 30 mA represent a 1 state. An input voltage range of 5 V to 11 V defines the transition region which describes neither a 0 nor a 1 state, where the input channel is able to draw a current of 2 mA to 30 mA in this transition region.

At low input voltages U up to a voltage $U_S$, the input channel has a resistive behavior and is also configured to limit the input current I to a first value $I_{Typ2}$ below $U_S$, the changeover voltage $U_S$ being greater than or equal to the voltage limit of 30 V, up to which the 1 signal state is represented. This first value $I_{Typ2}$ is 6 mA to 30 mA which is drawn by the input channel during the 1 state.

The input channel is also configured to limit the input current I to a second value $I_{Typ1}$ lower than the first value $I_{Typ2}$ above this changeover voltage $U_S$. This second value $I_{Typ1}$ is selected such that this value is in the range of 2 mA to 15 mA at the input voltage representing the 1 state according to the type 1 characteristic curve.

Figure 2:
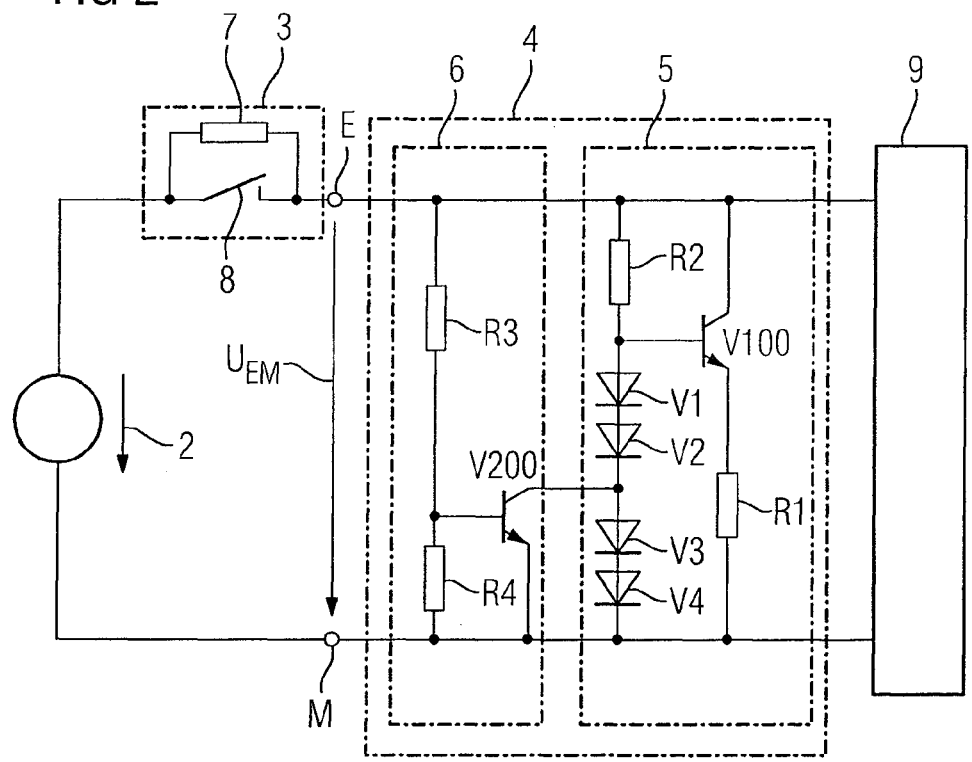
FIG. 2 shows input circuitry of a digital input unit connected to a transducer in accordance with the invention.

Reference is made below to FIG. 2 which illustrates a transducer or proximity switch 3, to which a nominal voltage 2 is applied, and input circuitry 4 of a digital input unit.

The input circuitry 4 comprises a current sink 5 and switching device 6 which switch the current sink 5 to a first operating mode and a second operating mode based on the input voltage at terminals E, M of the input circuitry 4.

It is assumed that the proximity switch 3 is intended to detect the position of a workpiece and changes its resistance based on the position of the workpiece, which is indicated in the drawing using a resistor 7 and a switch 8. This change in resistance influences an input voltage $U_{EM}$ at terminals E, M of the input circuitry 4, which is applied to a threshold evaluation unit 9 for determining a 0 or 1 signal state. In the first operating mode in which the input voltage $U_{EM}$ is below the changeover voltage $U_S$ (FIG. 1), which results from a resistance ratio formed by resistors R3, R4, a transistor V200 turns off. In this case, diodes V1, V2, V3, V4, together with a resistor R1, determine the first value $I_{Typ2}$ of the current I.

In a second operating mode in which the input voltage $U_{EM}$ exceeds the changeover voltage $U_S$ formed by the resistors R3, R4, the transistor V200 turns on and the current I is determined by the diodes V1, V2 and the resistor R1. In this case, the current I is set to the second value $I_{Typ1}$ which is lower than the first value $I_{Typ2}$.

Within the scope of the present consideration, the diode V1 can be disregarded because the voltage drop and the voltage drop across the base-emitter diode of a transistor V100 are compensated for, which transistor is connected in series with the resistor R1.

The invention can thus be summarized as follows:

A digital input unit for an automation device, having at least one current(I)-drawing DC input channel for connecting a transducer (3) operated at a nominal DC voltage, the input channel being configured to set the current (I) based on the input voltage ($U_{EM}$) according to an input characteristic curve, is distinguished by the fact that the input channel is also configured to limit the input current (I) to a first value ($I_{Typ2}$) up to a changeover voltage $U_S$, the changeover voltage ($U_S$) being greater than or equal to a voltage limit up to which a 1 signal state is represented, and to limit the input current (I) to a second value ($I_{Typ1}$) lower than the first value ($I_{Typ2}$) above this changeover voltage ($U_S$).

Such a digital unit is suitable for connecting transducers of different supply voltages and can be operated with a reduced power loss.

Thus, while there have shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A digital input unit for an automation device, comprising:
 a current-drawing DC input channel for connecting to a transducer operated at a nominal DC voltage at a node, the input channel generating an input current based on an input voltage at the node having an input characteristic curve;
 wherein the input channel further limits the input current to a first value up to a changeover voltage at said node, greater than or equal to a voltage limit up to which a 1 signal state is represented, and limits the input current to a second value lower than the first value above this changeover voltage.

2. The digital input unit as claimed in claim 1, wherein the input channel includes:
 a current sink operatively coupled to the node and configured to limit the input current, and
 an arrangement configured to drive the current sink based on the changeover voltage such that the input current is limited to one of the first value and the second value.

* * * * *